United States Patent [19]
Tozun et al.

[11] Patent Number: 5,559,477
[45] Date of Patent: Sep. 24, 1996

[54] PULSE GENERATOR HAVING CONTROLLED DELAY TO CONTROL DUTY CYCLE

[75] Inventors: Orhan Tozun, Monte Sereno; Chit-Ah Mak, Fremont; Werner Hoeft, Saratoga, all of Calif.

[73] Assignee: International Microcircuits, Inc., Milpitas, Calif.

[21] Appl. No.: 528,603

[22] Filed: Sep. 15, 1995

Related U.S. Application Data

[63] Continuation of Ser. No. 194,533, Feb. 10, 1994.

[51] Int. Cl.⁶ .............................. H03B 5/02; H03K 3/017; H03L 7/099
[52] U.S. Cl. .................. 331/97; 327/175; 327/171; 331/34; 331/45; 331/60; 331/75; 331/177 R
[58] Field of Search ................. 331/25, 34, 45, 331/57, 60, 75, 177 R; 307/601, 602, 603, 605, 606; 327/172, 175, 176, 250, 264, 281, 394, 404

[56] References Cited

U.S. PATENT DOCUMENTS

| | | |
|---|---|---|
| 4,797,585 | 1/1989 | Segawa et al. ................. 307/602 X |
| 5,039,893 | 8/1991 | Tomisawa ...................... 327/394 |
| 5,061,907 | 10/1991 | Rasmussen ...................... 331/57 |
| 5,068,628 | 11/1991 | Ghoshal ........................ 331/34 X |
| 5,119,045 | 6/1992 | Sato ........................... 331/57 X |
| 5,136,260 | 8/1992 | Yousefi-Elezei ................. 331/57 X |
| 5,175,452 | 12/1992 | Lupi et al. .................... 307/602 X |
| 5,231,313 | 7/1993 | Itoh ............................ 307/601 X |
| 5,302,919 | 4/1994 | Abe ............................. 331/57 X |
| 5,302,920 | 4/1994 | Bitting ......................... 331/45 |
| 5,347,232 | 9/1994 | Nishimichi ...................... 331/1 A |

*Primary Examiner*—Siegfried H. Grimm
*Attorney, Agent, or Firm*—Harry M. Weiss; Jeffrey D. Moy; Harry M. Weiss & Associates, P.C.

[57] ABSTRACT

Five CMOS inverters are connected in a series ring to form an oscillator. Current to the inverters is controlled to establish gate delays of the inverters and thereby determine a frequency of oscillation of the oscillator. The oscillator is included in a phase locked loop where the gate delay of the inverters is selected by selecting the value of a frequency divider of the phase locked loop. The selected delay is used to form a train of pulses with a desired duty cycle.

5 Claims, 5 Drawing Sheets

5,559,477

PULSE GENERATOR HAVING CONTROLLED DELAY TO CONTROL DUTY CYCLE

This is a continuation of co-pending application Ser. No. 08/194,533 filed on Feb. 10, 1994.

BACKGROUND OF THE INVENTION

1. Field of Invention

This invention is in the field of computer electronics and methods therefor and, more particularly, relates to apparatus and methods for causing a gate to have a selectable gate delay and method therefor.

2. Description of the Prior Art

The linchpin of a modern computer is a clock that provides clock pulses at a known frequency. Operation of components of the computer are typically synchronized to an edge of a clock pulse. A memory unit of the computer, for example, includes a plurality of binary storage elements where a signal representation of a number is stored by changing the state of some of the elements when the edge of the clock pulse occurs.

It should be understood that the components have respective clock input signal lines whereon the clock provides the clock pulses, thereby achieving the synchronous operation referred to hereinbefore. Similar to the memory unit, all of the components can only change state when the edge of the clock pulse occurs.

The clock lines have respective capacitances that load the clock. The loading may cause a distortion of the wave form of the clock pulse that results in improper operation of the components. The improper operation may be obviated by altering the duty cycle of the clock pulse to provide increased time for charging, or discharging, of the line capacitances during a portion of a clock cycle.

It is often desirable to provide a plurality of trains of pulses derived from the clock. Although each of the pulse trains has the same frequency, there is a known phase difference between the pulse trains. The plurality of pulse trains is provided by what is known as a multiphase clock, with a pulse train thereof being known as a phase of the multiphase clock.

With the multiphase clock, input/output (I/O) circuitry, for example, and an application specific integrated circuit (ASIC) may be synchronized to different phases of the multiphase clock, thereby causing a separation between the times that the I/O circuitry and the ASIC can change states. Additionally, phases of the multiphase clock may be logically combined to provide the clock pulse with the altered duty cycle.

Phases of the multiphase clock are usually generated by applying the clock pulses to a signal input of a shift register. Additionally, a shift register clock pulse train is provided to a clock input of the shift register. Outputs of stages of the shift register respectively generate phases of the multiphase clock. When it is desired to have the phase delay between phases of the multiphase clock resolvable to one nanosecond, the shift register clock pulses are at a frequency of at least one gigahertz.

As known to those skilled in the art, the shift register is necessarily of a type that has an undesirably high power consumption and is costly because the shift register clock has the one gigahertz frequency. Heretofore, there has not been an efficient, simple, economical way of generating high resolution phases of the multiphase clock.

SUMMARY OF THE INVENTION

An object of the present invention is to provide apparatus and a method for causing a CMOS device to have a selectable gate delay and method therefor.

BRIEF DESCRIPTION OF THE EMBODIMENTS

According to the present invention, a gate delay of a gate is determined by selecting the current supplied to the gate.

The invention provides a simple, efficient and economic apparatus for providing a train of pulses having a selectable duty cycle.

Other objects, features and advantages of the present invention will be apparent from the following description of embodiments thereof as illustrated in the accompanying drawing.

DESCRIPTION OF THE EMBODIMENTS

Figure 1:
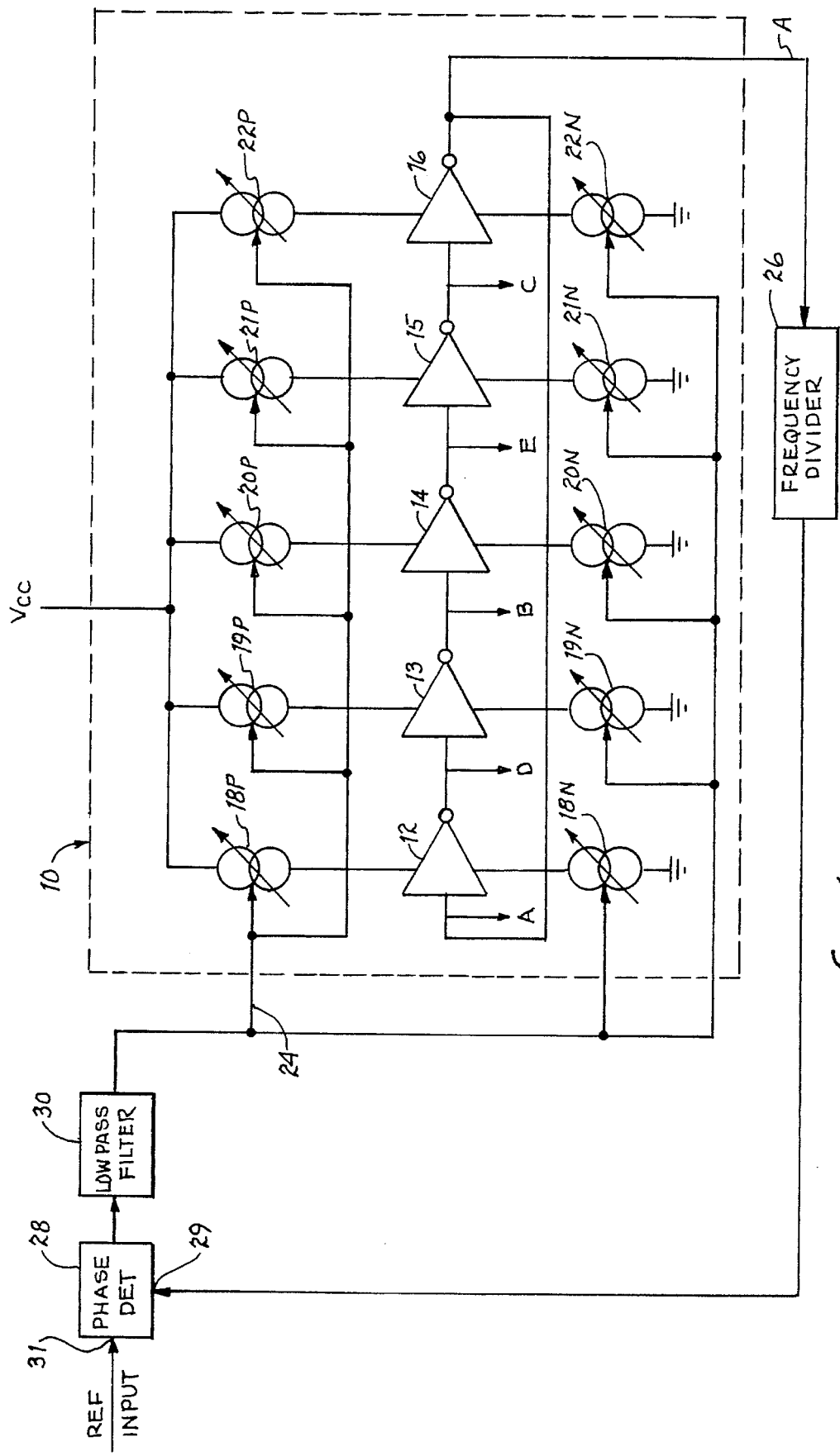
FIG. 1 is a schematic block diagram of a first embodiment of the present invention.

As shown in FIG. 1, in a first embodiment of the present invention, a voltage controlled oscillator (VCO) 10 includes similar inverters 12–16 connected in a series ring. More particularly, an output signal line, A, is connected to the input of inverter 12 and the output of inverter 16 and an output signal line, B, is connected to the input of inverter 14 and the output of inverter 13. Similarly, an output signal line, C, is connected to the input of inverter 16 and the output of inverter 15, an output signal line, D, is connected to the input of inverter 13 and the output of inverter 12, and an output signal line, E, is connected to the input of inverter 15 and the output of inverter 14. Since the series ring includes an odd number of inverters, an oscillator is formed by inverters 12–16. The oscillator has a frequency which is determined as explained hereinafter.

Voltage controlled current sources 18P–22P are connected between a voltage source, VCC, and P channel current inputs of inverters 12–16, respectively. Similarly, voltage controlled current sources 18N–22N are connected between ground and N channel current inputs of inverters 12–16, respectively. Control inputs of sources 18P–22P and 18N–22N are connected to a signal line 24 which forms the input of VCO 10.

P channel current and N channel current supplied to inverters 12–16 is directly related to a voltage applied to the control inputs. Sources 18P–22P are similar to each other and are preferably comprised of field effect transistors.

Correspondingly, sources 18N–22N are similar to each other and are preferably comprised of field effect transistors. Voltage controlled current sources are well known to those skilled in the art.

Inverters 12–16 are of CMOS construction. Because of the CMOS construction, gate delays of inverters 12–16 are inversely related to their N and P channel currents. Therefore, a voltage applied to line 24 controls the gate delays of inverters 12–16, with the gate delays of inverters 12–16 inversely related to the amplitude of the voltage applied to line 24.

The gate delays determine all important aspects of VCO 10. The period of oscillation of VCO 10 is in accordance with a gate delay relationship which is given as:

$$T=2nd$$

where

T is the period of oscillation;

n is the number of inverters; and d is the gate delay of an inverter.

Figure 2:
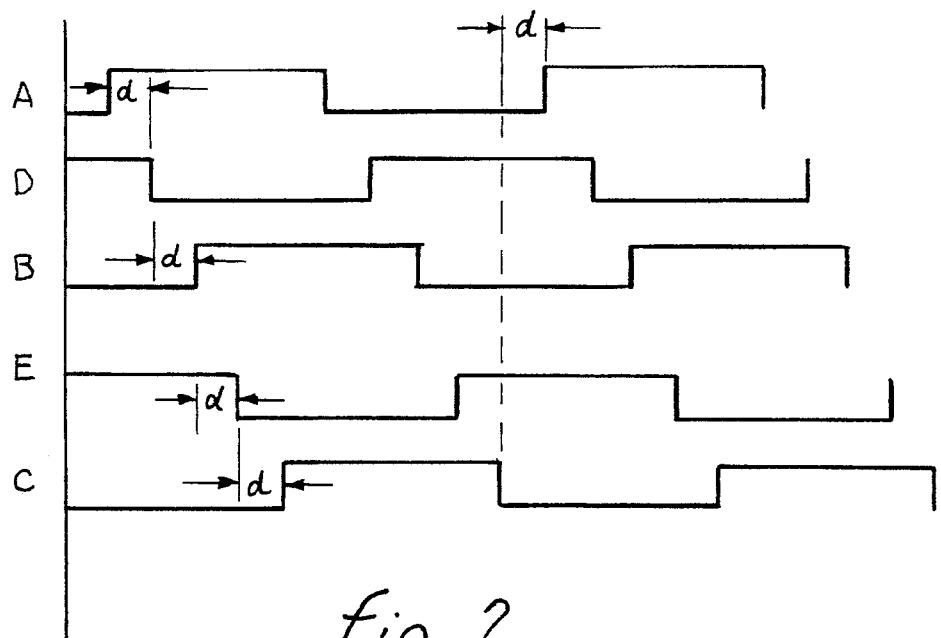
FIG. 2 is a showing of wave forms, all on the same time base, of a five phase clock in the embodiment of FIG. 1.
Figure 3:
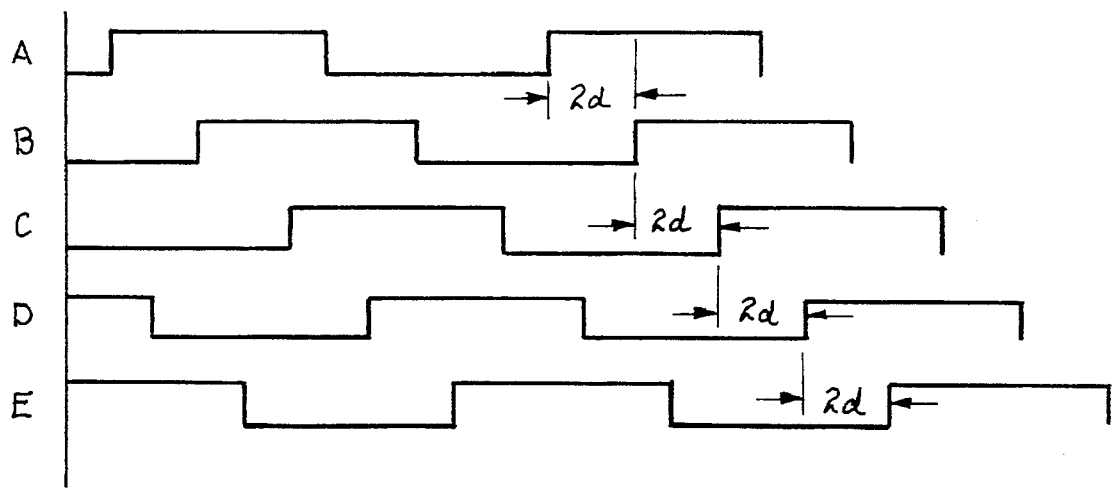
FIG. 3 is a showing of the wave forms of FIG. 2 rearranged to more clearly show the relationship between phases of the five phase clock.

As shown in FIGS. 2 and 3, the outputs of inverters 12–16 are respective phases of a five phase clock.

In this embodiment, output line A is connected to a frequency divider 26 at an input thereof whereby VCO 10 provides oscillator pulses to frequency divider 26. In response to the oscillator pulses, frequency divider 26 provides frequency divided pulses at a frequency equal to the oscillator frequency divided by the value of frequency divider 26.

Frequency divider 26 is preferably a digital programmable counter. The use of frequency divider 26 is explained hereinafter.

The output of frequency divider 26 is connected to a phase detector 28 at a feedback input 29 thereof. A reference input 31 of phase detector 28 is connected to a source (not shown) of a train of reference clock pulses. Typically, the reference clock pulses are derived from a crystal oscillator.

The output of phase detector 28 is connected through a low pass filter 30 to signal line 24. Phase detector 28 provides a voltage having an average amplitude that is proportional to a phase difference between the reference clock pulses and the frequency divided pulses.

As known to those skilled in the art, VCO 10, frequency divider 26, phase detector 28 and filter 30 are connected to form a phase locked loop. Because the phase locked loop is formed, the frequency of the pulses at input 29 is identical to the frequency of the pulses at input 31. In other words, the frequency divided pulses are at a frequency identical to the frequency of the reference clock pulses.

In accordance with the present invention and the phase delay relationship given hereinbefore, the value of frequency divider 26 is selected to cause a desired gate delay of each of inverters 12–16.

When, for example, it is desired to generate pulses of the five phase clock at a frequency of 100 megahertz and the reference clock has a frequency of one megahertz, frequency divider 26 has a value of 100. The frequency of the 100 megahertz five phase clock is divided by 100, thereby causing a feedback of frequency divided pulses at a frequency of one megahertz to input 29. The value of 100 is obtained by programming frequency divider 26 to be a modulo 100 counter. As explained hereinafter, because the value of frequency divider 26 is selected to cause the desired gate delay, pulse trains may be generated having a selectable duty cycle.

Figure 4:
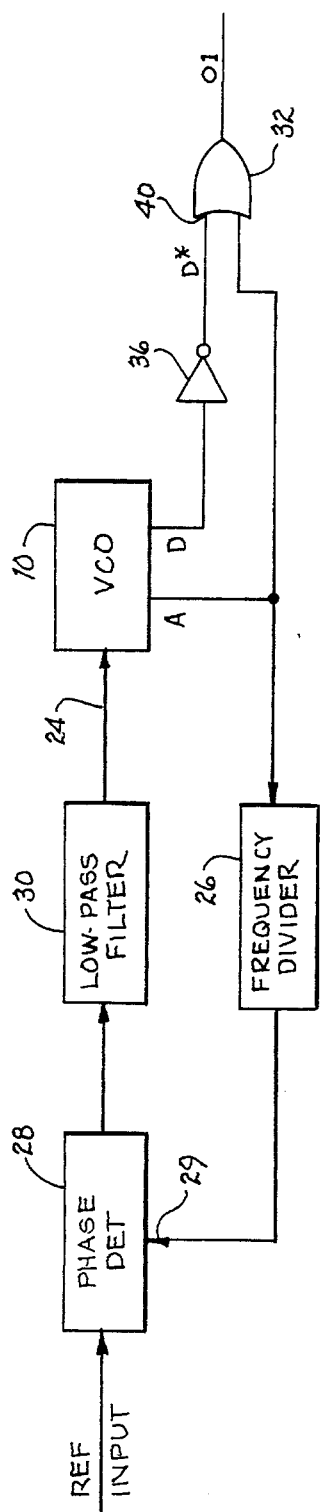
FIG. 4 is a schematic block diagram of a second embodiment of the present invention.

As shown in FIG. 4, in a second embodiment of the present invention, lines A and D are respectively connected to one of two inputs of an OR gate 32 and to an input of an inverter 36. The output of inverter 36 is connected to the other input of OR gate 32 through a signal line, D*. The output of OR gate 32 bears the designation, 01. It should be understood that the gate delay of inverter 36 is much less than the respective gate delays of inverters 12–16.

Figure 7:
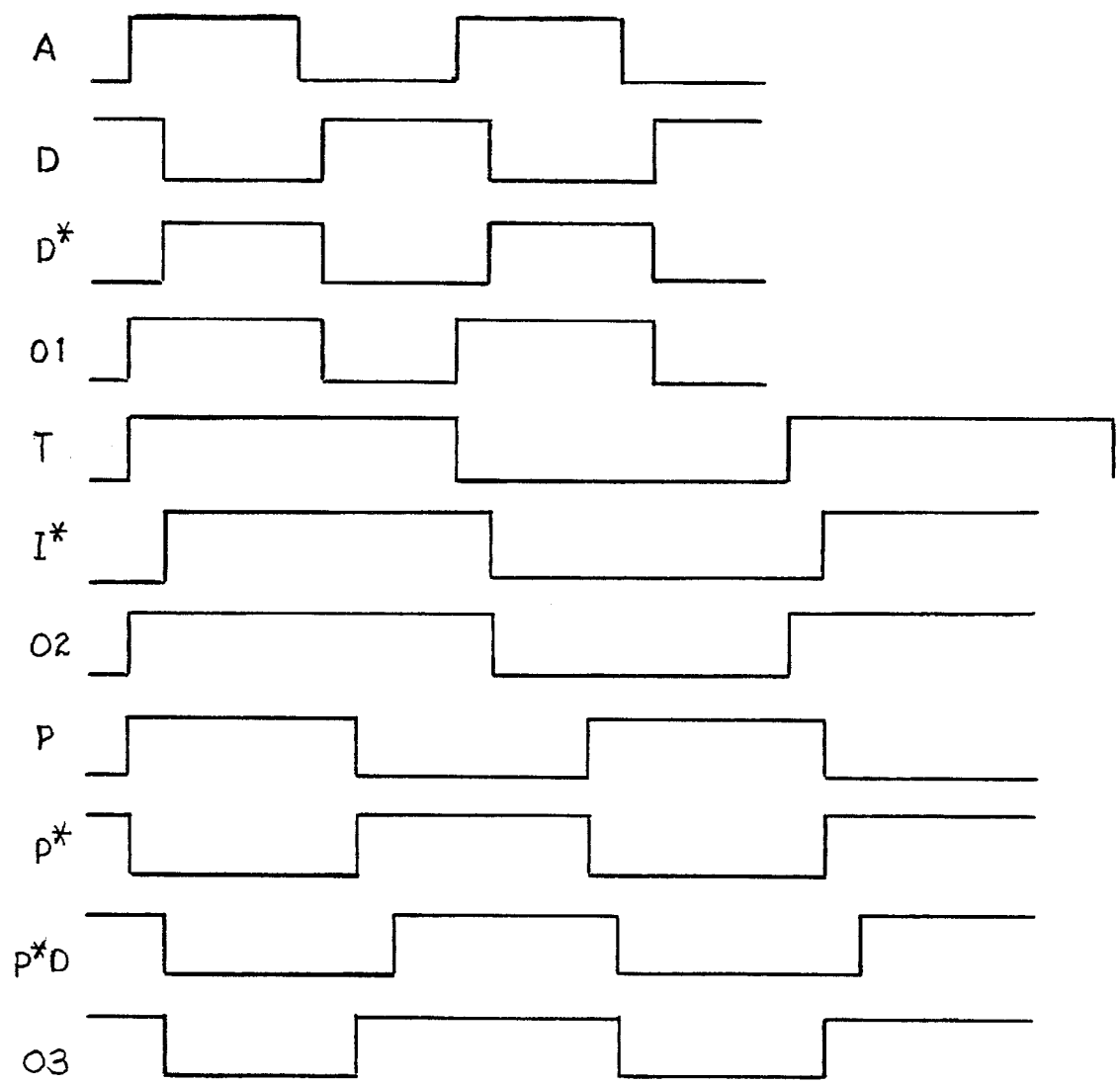
FIG. 7 is a showing of wave forms, all on the same time base, of wave forms associated with the second, third and fourth embodiments of the present invention.

As shown in FIG. 7, OR gate 32 logically combines the signal on lines A, D*, thereby causing output 01 to provide a signal of the same frequency as VCO 10, with a duty cycle that is 60% high and 40% low. By substituting a NOR gate for OR gate 32, the duty cycle of the 01 signal becomes 40% high and 60% low.

Figure 5:
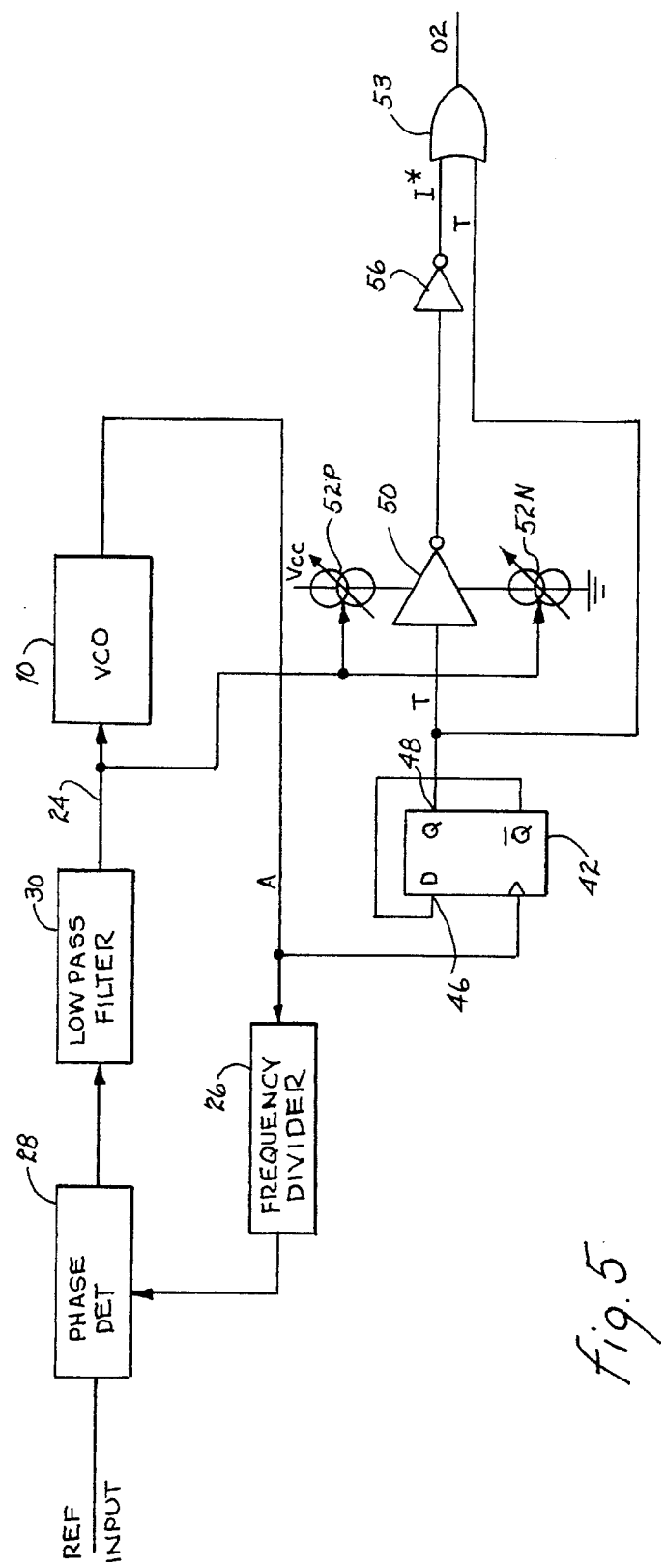
FIG. 5 is a schematic block diagram of a third embodiment of the present invention.

As shown in FIG. 5, in a third embodiment of the present invention, line A is connected to a clock input of a D flip flop 42. A D input 46 of flip flop 42 is connected to the complementary output of flip flop 42. As known to those skilled in the art, a true output 48 of flip flop 42 provides pulses at one half the frequency of VCO 10; the pulses have a 50% duty cycle. Hence, flip flop 42 is a frequency divider.

True output 48 is connected to the input of an inverter 50 through a signal line, T. Inverter 50 is similar to inverters 12–16.

A voltage controlled current source 52P is connected between the voltage source, VCC, and the P channel current input of inverter 50. Current source 52P is similar to sources 18P–22P.

A voltage controlled current source 52N is connected between ground and the N channel current input of inverter 50. Current source 52N is similar to sources 18N–22N.

Control inputs of sources 52P, 52N are connected through line 24 to the input of VCO 10. Because inverter 50 is similar to inverters 12–16, source 52P is similar to sources 18P–22P, source 52N is similar to sources 18P–22P and all current source control inputs are connected to line 24, the gate delay of inverter 50 is substantially equal to the respective gate delays of inverters 12–16.

Line T is additionally connected to one of two inputs of an OR gate 53. OR gate 53 is similar to OR gate 32.

The output of inverter 50, is connected to an input of an inverter 56. Inverter 56 is similar to inverter 36.

The output of inverter 56 is connected to the other input of OR gate 53 through a signal line, I*. The output of OR gate 53 bears the designation, O2. OR gate 53 is similar to OR gate 32.

As shown in FIG. 7, OR gate 53 logically combines the signals on lines T, I*, thereby causing output O2 to provide a train of pulses of one half the frequency of VCO 10 with a duty cycle of 55% high and 45% low. By substituting a NOR gate for OR gate 53, the duty cycle of the O2 signal becomes 45% high and 55% low.

Figure 6:
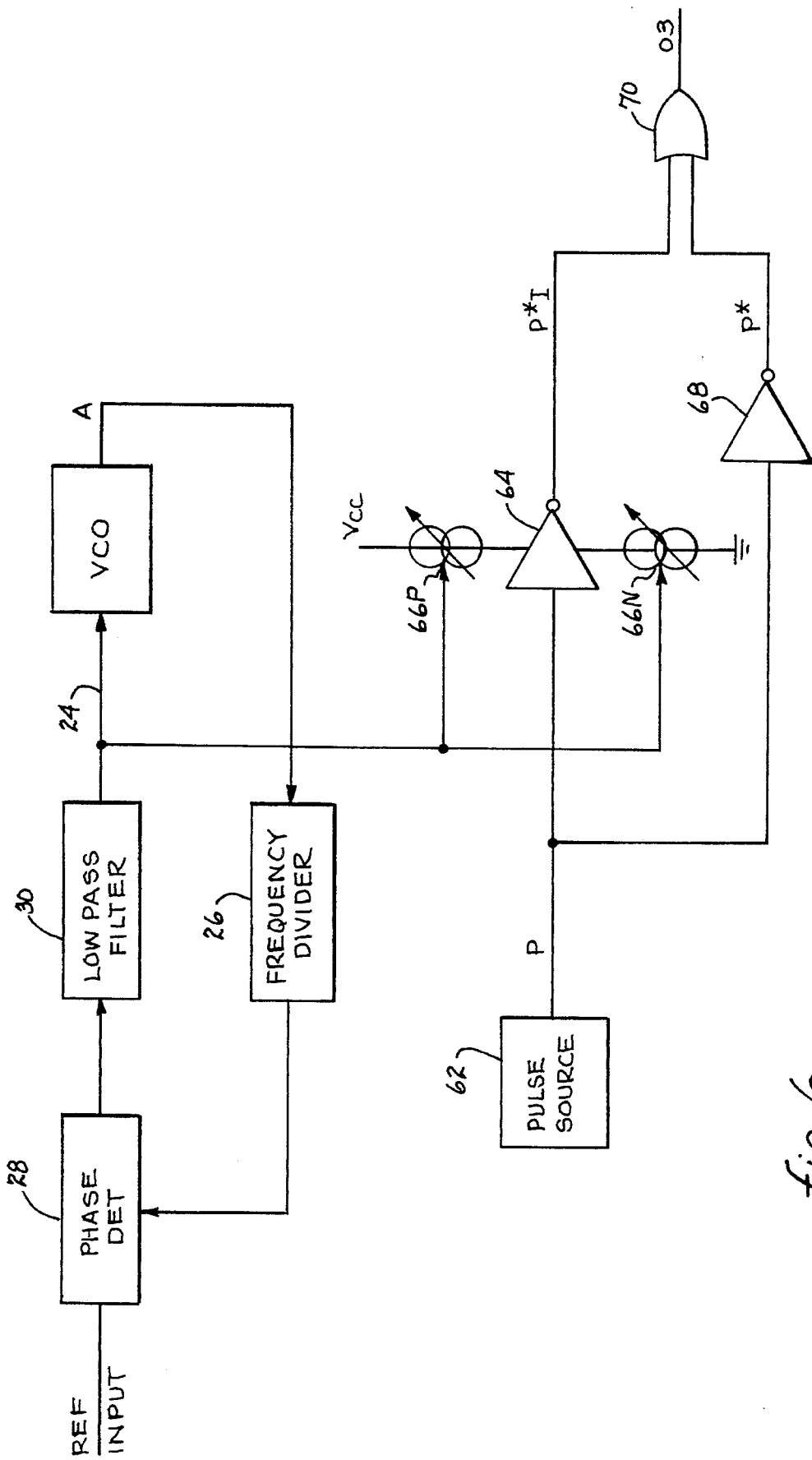
FIG. 6 is a schematic block diagram of a fourth embodiment of the present invention.

As shown in FIG. 6, in a fourth embodiment of the present invention, the output of a pulse source 62 is connected through a signal line, P, to the input of an inverter 64, whereby a train of pulses having a 50% duty cycle is provided to inverter 64. Inverter 64 is similar to inverters 12–16.

A voltage controlled current source 66P is connected between the voltage source, VCC, and the P channel current input of inverter 64. Source 66P is similar to sources 18P–22P.

A voltage controlled current source 66N is connected between ground and the N channel current input of inverter 64. Source 66N is similar to sources 18N–22N.

Control inputs of sources 66P, 66N are connected through line 24 to the input of VCO 10. For reasons similar to those given in connection with inverter 50 (FIG. 5), the gate delay of inverter 64 is substantially equal to the respective gate delays of inverters 12–16.

Line P is additionally connected to the input of an inverter 68 that is similar to inverter 36. The outputs of inverters 64, 68 are respectively connected to inputs of an OR gate 70 through signal lines P*I, P*. The output of OR gate 70 bears the designation, O3.

As shown in FIG. 7, the O3 output has a frequency equal to the frequency of pulses provided at output P with a duty cycle related to the signal provided through line 24. Accordingly, the duty cycle of the O3 signal may be selected by selecting the value of frequency divider 26.

The voltage provided by phase detector 28 includes an unwanted AC component. Low pass filter 30 substantially removes the unwanted AC component whereby a voltage having an amplitude substantially equal to the average amplitude of the voltage provided by phase detector 28 is provided through line 24.

While the invention has been particularly shown and described with reference to embodiments thereof, it should be understood by those skilled in the art that changes in form and detail may be made therein without departing from the spirit and the scope of the invention.

We claim:

1. A circuit for generating a train of pulses having a selectable duty cycle, comprising:

a source of pulses comprising:

an odd number of similar inverters connected in a series ring to form an oscillator; and delay means for causing said inverters to have a selectable gate delay, said delay means comprising:

an odd number of voltage controlled current sources equal in number to said inverters and respectively connected to P channel current inputs thereof; and an odd number of voltage controlled current sources equal in number to said inverters and respectively connected to N channel current inputs thereof, said current sources having respective control inputs connected to a source of a control voltage, said current sources each providing a current proportional to said control voltage whereby said inverters and said current sources form a voltage controlled oscillator (VCO), the inputs thereof being controlled inputs;

a gate having an input connected to said pulse source wherein said gate is an inverter of said oscillator;

means for causing said gate to have a selectable gate delay; and means for logically combining the output of said pulse source with the output of said gate.

2. The circuit of claim 1 wherein said gate is of CMOS construction.

3. The circuit of claim 1 wherein said means for causing comprises a pair of voltage controlled current sources respectively connected to a P channel current input and an N channel current input of said gate, said current sources having their control lines connected to said control voltage source.

4. The circuit of claim 1 wherein said gate is of CMOS construction and said means for causing comprises a pair of voltage controlled current sources respectively connected to a P channel current input and an N channel current input of said gate, said current sources having their control lines connected to said control voltage source.

5. The circuit of claim 1 wherein said pulse source additionally comprises a frequency divider having an input connected to the output of said inverter of said oscillator.

* * * * *